United States Patent [19]

Tompsett et al.

[11] Patent Number: 4,634,997
[45] Date of Patent: Jan. 6, 1987

[54] AUTOMATIC GAIN CONTROL AMPLIFIER CIRCUIT

[75] Inventors: Michael F. Tompsett, Summit; Edward J. Zimany, Jr., Morristown, both of N.J.

[73] Assignee: AT&T Bell Laboratories, Murray Hill, N.J.

[21] Appl. No.: 670,819

[22] Filed: Nov. 13, 1984

[51] Int. Cl.⁴ .............................................. H03G 3/30
[52] U.S. Cl. ................................... 330/284; 330/280; 330/279; 330/129
[58] Field of Search ................... 330/51, 86, 129, 279, 330/280, 281, 284; 333/81 R; 340/347 DA

[56] References Cited

U.S. PATENT DOCUMENTS 4,360,787 11/1982 Galpin ................................. 330/284
4,384,277 5/1983 Allgood et al. ............. 340/347 C X
4,441,080 4/1984 Saari .

OTHER PUBLICATIONS

P. E. Fleischer et al, "A Single-Chip Dual-Tone and Dial-Pulse Signaling Receiver," 1982 *IEEE International Solid-State Circuits Conference*, Feb. 11, 1982, pp. 212-214.

J. H. Davis, "Bi-FET Op Amps Simplify AGC Threshold Design," *Electronics*, Apr. 21, 1981, pp. 184-185.

*Primary Examiner*—Eugene R. LaRoche
*Assistant Examiner*—Steven J. Mottola
*Attorney, Agent, or Firm*—David I. Caplan

[57] ABSTRACT

An automatic gain control (AGC) amplifier circuit uses a control loop comprising a digital counter (70) which controls a multiplying digital-to-analog converter (10) arranged as an attenuator of the input v to the AGC. The counter (70) is arranged to count up or down depending upon the output signal of the AGC circuit. In addition, a latency can be introduced into the control loop so that in case of most signal envelope variations, the counter is frozen to prevent output fluctuations.

4 Claims, 6 Drawing Figures

AUTOMATIC GAIN CONTROL AMPLIFIER CIRCUIT

FIELD OF THE INVENTION

This invention relates to semiconductor amplifier circuits and more particularly to such circuits that include automatic gain control (AGC) means.

BACKGROUND OF THE INVENTION

In the transmission of information from a sender to a receiver, typically a signal s representing the information at the sender is used to modulate, either in an analog or in a digital manner, the phase and/or amplitude of a purely sinusoidal carrier wave. The frequency of the carrier can also (or instead) be modulated, but for the sake of simplicity, such modulation will not be discussed further. The phase and/or amplitude-modulated carrier wave is transmitted from the sender to the receiver through a transmission medium or channel: a wire in the case of wire telephony, the atmosphere in the case of wireless (radio, microwave) telephony, an optical fiber in the case of optical telephony. In any case, the carrier in the presence or absence of signal (modulated or unmodulated carrier) arrives at the receiver where it is converted by a detector into a modulated sinusoidal electrical voltage signal v of the form $v = a \sin(2\pi f t - \phi)$ where a is the amplitude, f is the frequency, and $\phi$ is the phase of the thus detected voltage v. In a phase and/or amplitude-modulated signal, amplitude a and/or phase $\phi$ in general can vary as a function of time. Ideally, the variations of a and $\phi$ are strictly in accordance with the modulations of amplitude and phase of the carrier at the sender corresponding to the signal s. By "ideally" it is meant in the absence of noise and other disturbances. These ideal variations of a and $\phi$ constitute the useful signal (information) component in the voltage v at the receiver. The remaining component in v ideally represents the carrier component. A demodulator at the receiver then extracts and detects the useful signal component contained in the voltage signal v, by a process called "demodulation"; that is, a demodulator removes the carrier component from v, whereby only the signal component remains.

Ideally, therefore, when the carrier is being sent in the absence of any signal s at the sender (s=0, unmodulated carrier), the amplitude a and the phase $\phi$ of the voltage v detected at the receiver should both be constants. On the other hand, when a signal s is indeed present at the sender and modulates the carrier, the voltage v detected at the receiver will have a signal component corresponding to s in addition to a carrier component; that is, in the presence of signal s, either the amplitude a of the detected voltage v or the phase $\phi$ thereof, or both, are not constants but will vary in a manner depending upon the signal and the type of modulation being employed. In practice, however, even in the absence of any signal s at the sender, the amplitude a of the detected voltage v at the receiver unavoidably spuriously varies from time to time and place to place, owing to unavoidable variations or disturbances in the sending properties of the sender (such as fluctuations in the power level of the carrier) or owing to variations or disturbances in the transmission properties of the transmission medium or channel (such as noise). The same disturbances that produce these unavoidable spurious variations in the amplitude a of the detected voltage v at the receiver when no signal s is being transmitted also produce, when a signal s is indeed being transmitted, corresponding unavoidable spurious variations in the signal component of the amplitude a of the detected voltage v at the receiver. If adequate measures are not taken in the demodulation process to compensate for these spurious variations in amplitude a, the demodulation process will yield correspondingly spurious variations in amplitude of the extracted signal. Accordingly, workers in the art have developed automatic gain control (AGC) circuits to restore the amplitude of the carrier component of the detected voltage v to a fixed predetermined level and at the same time thereby correspondingly to restore the relative amplitude of the signal component to its ideal level, i.e., to remove the spurious variations.

In prior art, an AGC circuit typically comprises an amplifier circuit having an automatically variable gain. The detected voltage signal v is applied as input to the amplifier which amplifies the detected voltage v at the receiver with a controllably variable gain g that varies inversely with the instantaneous value of v. Accordingly, the instantaneous corresponding value of the signal strength s of the output of the amplifier, and hence also of the AGC circuit, is equal to gv. In order to achieve such a controllable gain g, a control (feedback) loop in the circuit is constructed to increase the gain g (as by decreasing the attenuation) of the AGC circuit when the instantaneous value of gv is below a desired voltage level L, and to decrease the gain g thereof (as by increasing the attenuation) when the instantaneous value of gv is above the desired level L. Thus, the AGC circuit tends to adjust gv to be equal to L.

For example, when the value of v is a steady zero (no carrier or signal), the control loop in an AGC circuit steadily increases the gain g (decreases the attenuation) until finally the gain reaches its maximum (attenuation is zero) possible value allowed by the circuit. Then, for example, starting from a moment of time when v suddenly jumps from the previous steady value of zero to a new finite steady value $v_1$, the control loop tends to adjust the gain g such that $gv_1 = L$. The time it takes for the control loop thus to adjust the gain g of the amplifier circuit from the maximum to the required level ($L/v_1$) (and thus produce a steady state output) is called the "acquisition time". Conversely, starting from a moment of time later on when v suddenly jumps from $v_1$ back to the steady value of zero, the time it takes for the control loop to (re)adjust the gain g back to the maximum value is called the "release time". As known in the art, the acquisition time is made much shorter than the release time, typically by a factor in the range of at least 10 to 100. Moreover, the period of the carrier desirably is made shorter than the release time, to prevent undesirable distortion from being introduced into the output of the AGC circuit.

Another source of undesirable distortion arises from any dc offset in the detected voltage v at the receiver or any dc offset in the AGC amplifier. The presence of such offsets, among other things, undesirably changes the gain of the AGC amplifier from its ideal value, thereby introducing spurious signals into the AGC control loop. Accordingly, precautions are ordinarily taken to reduce such offsets to negligible values.

In general, a comparator is used in the control loop of a typical AGC amplifier for continually sensing whether the instantaneous value of the amplifier output voltage gv is greater or less than the desired level L. If the amplifier output gv instantaneously goes to a value which is greater than L, then the control loop acts to decrease the gain (or increase the attenuation) of the amplifier at a relatively fast rate, determined by the acquisition time. If the AGC output gv goes less than L, then the control loop acts to increase the gain (or decrease the attenuation) of the amplifier at a relatively slow rate, determined by the release time. Accordingly, in response to a purely sinusoidal detected voltage $v = a \sin(2\pi ft - \phi)$, i.e., with constant a and constant $\phi$, ultimately the amplifier settles into a steady state, as illustrated in FIG. 1. More specifically, during those relatively long time intervals $t_2t_3$, $t_4t_5$, etc., when the amplifier output signal voltage strength $s = gv$ is less than the prescribed level L, the gain g of the amplifier is being increased (attenuation is being decreased) by the control loop at a relatively slow rate; and during those relatively short time intervals $t_1t_2$, $t_3t_4$, $t_5t_6$, etc., when the amplified voltage gv is greater than the prescribed level L, the gain g of the amplifier is being decreased (attenuation is being increased) by the control loop at a relatively fast rate. Thus, since the circuit is assumed to be in a steady state, the ratio of each of the mutually equal short time intervals $t_1t_2$, $t_3t_4$, $t_5t_6$, etc., to each of the mutually equal long time intervals $t_2t_3$, $t_4t_5$, etc., is equal to the ratio of the (short) acquisition time to the (long) release time, provided that the control loop is linear, i.e., that the rate at which the gain increases (during release) is a (relatively small) constant and the rate at which the gain decreases (during acquisition) is a (relatively large) constant. Note that as a consequence of the relative shortness of the time intervals $t_1t_2$, $t_3t_4$, $t_5t_6$, etc., as compared with $t_2t_3$, $t_4t_5$, etc., amplitude ga of the amplifier sinusoidal $v = a \sin(2\pi ft - \phi)$ in the steady state will be only slightly above the level L, owing to the relatively flat profile of a sinusoid near its maximum and the resulting relatively small difference between the magnitudes of ga and L (FIG. 1). Hence the average gain g is thus only slightly greater than L/a. Moreover, in the steady state, again as a consequence of the relative shortness of the (acquisition) time intervals $t_1t_2$, $t_3t_4$, $t_5t_6$, etc., during which the gain g can change rapidly (i.e., gain decreases rapidly during acquisition), the value of g in the steady state does not significantly change during any such interval $t_1t_2$, $t_3t_4$, $t_5t_6$, etc. Similarly, during the relatively long (release) time intervals $t_2t_3$, $t_4t_5$, etc., during which the gain g changes only slowly (i.e., gain increases slowly during release), the value of g does not significantly change during any such (release) time interval. The rate of change of g is selected for the AGC amplifier such that during release the value of g does not change very much during a single period T of the carrier. Thus, the gain g of an AGC amplifier fluctuates only very slightly during the steady state, as is desired for low distortion.

Note also that if during the steady state the gain g of the AGC amplifier circuit were to increase for some reason (such as a random distribution in the control loop), so that ga would then be greater than its steady state value, then (since L is fixed) the time intervals $t_1t_2$, $t_3t_4$, $t_5t_6$, etc., would suddenly increase, the intervals $t_2t_3$, $t_4t_5$, etc., would suddenly decrease, and the gain g would therefore experience an overall decrease during each period T because of the AGC control loop until the steady state value of ga would be restored and the steady state would thus be attained again. Similarly, in case of a sudden decrease in the gain g, the AGC amplifier would restore the steady state value of the gain. Likewise, if the amplitude a of the carrier suddenly changes, so that ga is no longer its steady state value, the AGC control loop will similarly react to restore ga back to its steady state value and thus restore the steady state of the AGC amplifier circuit. Thus, the steady state illustrated in FIG. 1 by the particular sinusoidal curve gv, with gain g such that the amplitude ga is slightly greater than L, is a stable equilibrium condition of the AGC amplifier circuit.

In a typical control loop in an AGC circuit, a comparator senses the output gv of the amplifier, compares it with the desired level L, and develops an error signal. The comparator delivers this error signal to a variable current source such that the current source delivers a relatively high predetermined positive current to, and charges up relatively quickly, a storage capacitor in response to a control loop error signal of one polarity, and the comparator delivers a relatively low predetermined negative current to, and thereby discharges relatively slowly, the same storage capacitor in response to a control loop error signal of the opposite polarity. A variable attenuator is controlled by the instantaneous voltage of the capacitor and controls the attenuation imparted to the AGC input voltage v. The charge stored in the capacitor and hence the voltage across the capacitor (relative to ground) thus determines the attenuation imparted to the input v of the AGC circuit by means of the variable attenuator which reduces the voltage delivered to the amplifier in proportion to the charge stored in the capacitor. Such a variable attenuator, for example, can be formed by the variable resistance (to ground) of an MOS transistor, whose source-drain resistance path connects the AGC input v to ground, whose gate terminal is connected to the storage capacitor, and hence whose source-drain resistance and hence attenuation is controlled by the voltage of, and hence the charge stored in, the capacitor.

On the other hand, the control loop of an AGC circuit introduces undesirable signal distortion into the amplifier output gv and hence into the demodulation process in addition to the previously mentioned distortion caused by a finite release time. In particular, signal distortions in gv are caused by the fact that various components in the control loop are nonideal (nonlinear) in their respective responses. For example, in the typical control (feedback) loop of an AGC circuit, owing to a finite resistance across the storage capacitor as needed to produce a finite release time, the charge stored therein unavoidably leaks away at a finite rate, and hence the charge that thus leaks away—for example, during each period T (FIG. 1) of a sinusoidal input signal v—must be replenished by the current source in order to maintain the steady state. Accordingly, in this steady state, the time intervals $t_1t_2$, $t_3t_4$, $t_5t_6$, etc., must all be finite to accomplish this replenishing of charge, but this finite value of $t_1t_2$, $t_3t_4$, $t_5t_6$, etc., results in the gain g undesirably varying by a finite amount during the course of each period T; and hence the distortion in gv likewise undesirably occurs. Moreover, the source-drain path of an MOS transistor does not have a linear source-drain current versus source-drain voltage response (at constant gate voltage), especially in case of relatively large source-drain voltage swings; therefore, the variable attenuator formed by the source-drain path of the MOS transistor introduces undesirable distortion into the (amplified) AGC output voltage gv, i.e., corresponding to the nonlinearity of the transistor's source-drain current response to its source-drain voltage. Furthermore, the control loop has a finite response time owing to various inherent delays in its various components. Therefore, when the detected voltage v changes to a different instantaneous value, the control loop does not act immediately to change correspondingly the gain g of the AGC circuit. Thus, for example, if the detected voltage v changes in an ideal case from one steady dc value $a_1$ to another steady dc value $a_2$, then the AGC seeks ("hunts") to adjust the gain to its proper value $g = L/a_2$ but does not do so immediately: instead, the gain tends to oscillate around its proper value, whereby an undesirable jitter is introduced into the amplified output gv even in the ideal case of a steady dc detected voltage v. Such jitter is thus exacerbated in the practical case of constantly varying signal components in the detected voltage v.

Accordingly, it would be desirable to have an AGC circuit in which the distortions in the output caused by the AGC control loop are mitigated.

SUMMARY OF THE INVENTION

In accordance with the invention, a control loop in an AGC amplifier circuit comprises a multiplying digital-to-analog converter—such as a switched capacitor attenuator—which is connected for attenuating an input signal v and whose attenuation is controlled by a control signal derived from the output of the AGC circuit. More specifically, the control signal is supplied by a digital electronic counter which is controlled by a comparator, and the comparator has one of its input terminals connected to receive the output of an AGC amplifier arrangement whose input is the output of the attenuator, and another of the input terminals of the comparator is connected to receive a steady desired voltage level L. In particular, an AGC amplifier circuit in accordance with the invention comprises:

(a) a digital electronic counter;
(b) a switched capacitor attenuator connected for attenuating an input signal, in accordance with the instantaneous reading of the counter, to produce an attenuated signal;
(c) an amplifier arrangement connected for receiving the attenuated signal and for developing an amplified output signal in accordance with the attenuated signal; and
(d) comparator means connected for receiving the amplified output signal and for generating a binary comparator output signal to increase or decrease the reading of the counter depending upon whether the amplified output signal is above or below a desired level.

Advantageously, the circuit further comprises a latency circuit, connected for integrating the binary comparator output signal and for enabling the reading of the counter to increase or decrease when and only when the binary signal integrates to a value which is above or below, respectively, first or second reference values. Such a circuit has been fabricated in accordance with the invention so that the signal distortion of the circuit is less than about −50 dB with a dynamic range of more than about 38 dB. The use of a digital electronic counter, instead of the storage capacitor, furnishes a leak-proof device for storing control loop information simply because an electronic counter utilizes static binary transistor memory cells (flip-flops) which reliably hold the control loop information without leakage or other degeneration. Moreover, the use of the capacitor attenuator provides a desirably more nearly precisely linear response, and the latency circuit suppresses the undesirable instability problem (jitter) at some small sacrifice of the speed of automatic gain control in case of small changes in input signal amplitude.

BRIEF DESCRIPTION OF THE DRAWING

This invention together with its features and advantages may be better understood from the following detailed description when read in conjunction with the drawing in which.

DETAILED DESCRIPTION

Figure 2:
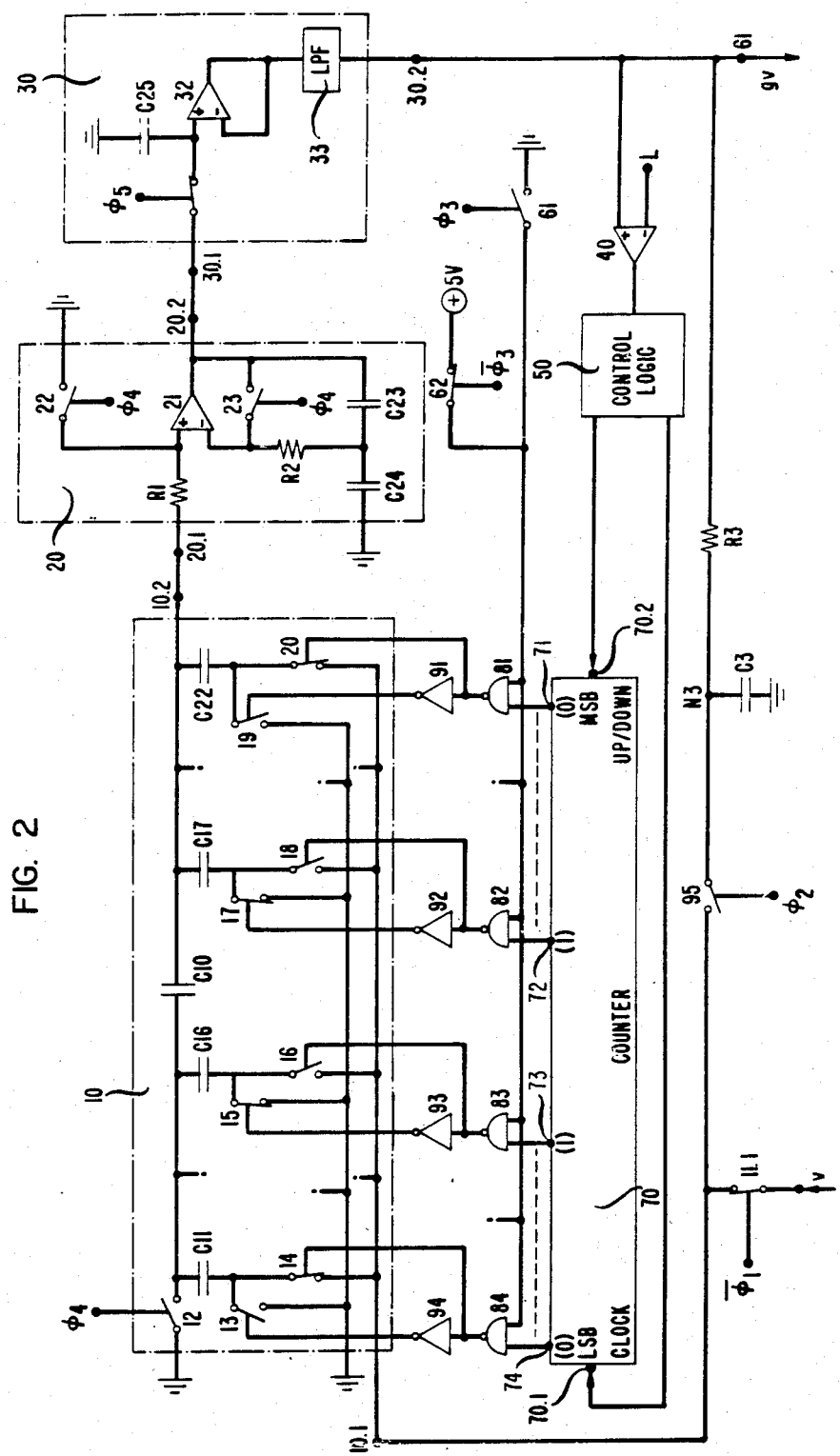
FIG. 2 is a diagram of an AGC circuit in accordance with a specific embodiment of the invention.

FIG. 2 illustrates an AGC circuit, in accordance with the invention. Briefly, it contains an input terminal 11 to which the AGC input signal v is applied with signal frequency components typically in the range of about 600 to 3,000 Hz, an output terminal 61 at which the AGC output signal gv is developed, together with a switched capacitor attenuator 10, an amplifier arrangement 20, a sample-and-hold circuit 30, and a control loop containing a comparator 40, a control logic device 50, a digital counter 70, and a lowpass filter formed by R3 and C3. Also, there are various switches that are clocked by clock pulse sequences $\phi_1$, $\phi_2$, $\phi_3$, $\phi_4$, and $\phi_5$, as illustrated in FIG. 2. The periodicity of the sequences and hence of the switching is denoted by $t_S$. Typically, the frequency $f_S = 1/t_S$ of the switching is about 153 KHz. More specifically, when a clock sequence goes high, the corresponding switch turns on. Each such clocked switch can thus be an n-channel transistor (NMOS technology) or preferably an n-channel transistor in parallel with a p-channel transistor (CMOS technology) where the p-channel transistor is clocked with the complementary clock pulse sequence $(\overline{\phi})$. The input terminal 11 of the AGC circuit (FIG. 2) is connected through a first clocked $(\overline{\phi}_1)$ switch 11.1 both to a second clocked switch 95 and to an input terminal 10.1 of the capacitor attenuator 10. Because of this connection of the input terminal 10.1 of the attenuator to the input terminal 11 of the AGC circuit by means of the clocked switch 11.1, the input terminal 10.1 of the attenuator may be viewed as a clocked input terminal of the AGC circuit. The attenuator also has an output terminal 10.2 to which an array of capacitors C10, C11, . . . , C16, C17, . . . , C22 in the attenuator is interconnected as shown. In particular, each of the capacitors C11, . . . , C16 has a (top) terminal connected in common to the left-hand terminal of the capacitor C10, and each of the capacitors C11, . . . , C16 has a top terminal connected (in common) to the right-hand terminal of the capacitor C10. The left-hand terminal of the capacitor C10 is connected through a clocked ($\phi_4$) switch 12 to a fixed reference voltage source (ground); the right-hand terminal of this capacitor C10 is connected directly to the output terminal 10.2 of the attenuator 10.

Advantageously, the capacitors C11, ..., C16 (a total of six capacitors) have capacitance values in an ascending order according to a geometric series with a ratio of 2; that is, each capacitor has twice the capacitance of the one located on its left-hand side. For example, the capacitor C11 has a capacitance of 0.5 picofarad; the capacitor C12 (not shown explicitly) 1.0 picofarad; etc.; the capacitor C16, 16 picofarad (just as in a conventional multiplying digital-to-analog converter). The capacitance of C10 (including parasitics) is advantageously equal to that of C11 (including parasitics). Similarly, each of the capacitors C17, ..., C22 (also a total of six capacitors) has a capacitance value that is equal, respectively, to the capacitance of C11, ..., C16 (i.e., C11=C17, ..., C16=C22). For example, C17 is 0.5 picofarad, and C22 is 16 picofarads. Thus, the capacitors C10, C11, ..., C16, C17, ..., C22 form a multiplying digital-to-analog converter with a most significant bit (MSB) corresponding to C22, which is $2^{6+6}(=2^{12})$ times as large as the least significant bit (LSB), corresponding to C11. The bottom terminal of the capacitor C11 is connected to the top terminal of a switch 13 and to the top terminal of another switch 14. The bottom terminal of the switch 13 is connected to the reference terminal (ground), and the bottom terminal of the switch 14 is connected to the terminal 10.1 of the attenuator. Similarly, the bottom terminal of the capacitor C16 is connected through switches 15 and 16, respectively, to the reference terminal (ground) and the input terminal 10.1 of the attenuator; and likewise capacitors C17 and C22 are respectively connected through switches 17 and 19 to the reference (ground) and through switches 18 and 20 to the input terminal 10.1 of the attenuator.

The output terminal 10.2 of the attenuator 10 is connected to the input terminal 20.1 of the amplifier arrangement 20. This amplifier arrangement 20 includes an operational amplifier 21 (i.e., of very high open loop gain, typically an open loop gain of about 10,000 or more), with a positive input terminal connected through a resistor R1 to the input terminal 20.1 of the amplifier arrangement 20 and through a clocked ($\phi_4$) switch 22 to the reference (ground). A negative input terminal of the amplifier 21 is connected to the output terminal of this same amplifier through two parallel paths: one path formed by a clocked ($\phi_4$) switch 23 and the other path formed by a capacitor C23 and a resistor R2. A node between the capacitor C23 and resistor R2 is connected through another capacitor C24 to the reference (ground). For example, the open loop gain of the amplifier 21 is about 10,000 or more; the resistors R1 and R2 are both about 2.5 kilohms for the purpose of reducing voltage spikes during switching; the capacitor C23 is about 1 picofarad; and C24 is about 32 picofarads. Thus, during operation, the amplifier arrangement 20 has an effective (closed loop) gain equal to (C24+C23)/C23=33.

The amplifier arrangement 20 has an output terminal 20.2 which is connected to an input terminal 30.1 of a sample-and-hold circuit 30 containing a clocked ($\phi_5$) switch 31, a capacitor C25, an operational amplifier 32, and an operational amplifier "Sallen-Key" lowpass filter 33 (typically to pass all frequency components below about 20 KHz while blocking the (153 KHz) switching frequency $f_S$). The amplifier 32 is connected in its unity gain configuration, i.e., with its output terminal directly connected to its negative input terminal. The capacitance of C25 is illustratively 10 picofarads.

The output terminal 30.2 of the sample-and-hold circuit 30 is connected to the AGC circuit output terminal 61, to a positive input terminal of the comparator 40, and to the resistor R3. A negative input terminal of the comparator 40 is connected to a steady dc voltage source of the desired level L; and the output terminal of the comparator 40 is connected to the control logic 50 device, whereby during operation the comparator 40 delivers a high voltage level (logic high) as input to the control logic 50 when the voltage at the AGC output gv at the terminal 61 is higher than L and delivers a low voltage level (logic low) to the control logic when the AGC output gv is lower than L. The control logic device 50 is connected for delivering one of its outputs to a clock input terminal 70.1 of the counter 70 and for delivering the other of its outputs to an up/down control input terminal 70.2 of the counter 70. In this way, when the control logic 50 delivers a high voltage level to the up/down terminal 70.2, the counter 70 counts up if and only if a clock pulse sequence is being applied at the clock input terminal 70.1, and when the control logic 50 delivers a low voltage level to the up/down terminal 70.2, the counter 70 counts down if and only if again a clock pulse sequence is being applied to the clock input terminal 70.1; otherwise, if no clock pulse sequence is being applied to the clock input terminal 70.1, then the reading of counter 70 does not change, regardless of the voltage level at the up/down terminal 70.2. In any case, the counter will count at the frequency of the clock pulse sequence being applied to the clock input terminal 70.1, and it will count up or down depending upon the high versus low level then being delivered to the up/down terminal 70.2.

As shown in FIG. 2, illustratively the counter 70 instantaneously has a reading of binary 0 at counter reading MSB output terminal 71, ..., binary 1 at another counter reading output terminal 72, binary 1 at yet another counter reading output terminal 73, ..., and binary 0 at counter LSB output terminal 71.

Each of counter reading output terminals 71, ..., 72,73, ..., 74 is separately connected, respectively, to an input terminal of a separate one of NAND gates 81, ..., 82,83, ..., 84. Another input terminal of each of these NAND gates is connected in common through clocked ($\phi_3$, $\overline{\phi_3}$) switches 61 and 62, respectively, to the reference (ground) and to a 5 volt dc source. Each output terminal of the NAND gates 81, ..., 82,83, ... , 84 is separately connected, respectively, to an input terminal of inverters 91, ..., 92,93, ..., 94 and, respectively, to a control terminal of switches 14, ..., 16,18, ..., 20. Each output terminal of the inverters 91, ..., 92,93, ..., 94 is separately connected, respectively, to a control terminal of switches 13, ..., 15,17, ..., 19. Thus, when the output of a NAND gate (say 83) is low, the output of the corresponding inverter (93) is high, and hence the bottom terminal of the corresponding capacitor (C16) is connected through the corresponding switch (15) to the ground reference; and when the output of a NAND gate (say 84) is high, the output of the corresponding inverter (94) is low, and hence the bottom terminal of the corresponding capacitor (C11) is connected through the corresponding switch (14) to the input AGC circuit terminal 10.1. Thus, the reading of the counter is linearly proportional to the attenuation of the attenuator 10. For example, the reading (0 ... 11 .. . 0) of the counter corresponds to an attenuation equal to $A(0\times2^{12}+ \ldots +1\times2^7+1\times2^6+ \ldots +0\times2^0)$, where A is a constant.

The AGC output terminal 61 is connected directly through the resistor R3 to the top terminal at node N3 of the capacitor C3, whose bottom terminal is connected to the reference (ground), and through a clocked ($\bar{\phi}_2$) switch 95 to the clocked ($\bar{\phi}_1$) switch 11.1, thereby completing an overall dc feedback loop. For example, R3 is about 100 kilohms and C3 is about 1 microfarad, whereby the associated time constant R3C3 is about 0.1 second, and hence the lowpass filter formed by R3C3 has a lowpass frequency range sufficient to define any undesirable offset in the output gv. As more fully described below, when the clocked ($\phi_2$) switch 95 is closed, the filter R3C3 delivers the offset—as feedback developed at node N3, as derived (by filtering) from the (AGC circuit) output gv at the AGC output terminal 61—to the attenuator 10 in such a way as to subtract this offset from the AGC input signal v.

It should be understood that the counter 70 advantageously includes a wrap-around suppressor to prevent the reading of the counter from continuing to advance (count-up) or recede (count-down) after the maximum or minimum reading, respectively, has been attained.

The operation of the clock pulse sequences can be summarized as follows. When $\phi_1$ is low ($\bar{\phi}_1$ is high), e.g., at time $t_{10}$, the input signal v is connected (to the attenuator); when $\phi_2$ is high, e.g., at $t_{12}$, the offset feedback voltage at node N3 is connected to the attenuator 10; when $\phi_3$ is low, e.g., at $t_{10}$, the counter reading is connected to the attenuator; when $\phi_3$ is low ($\bar{\phi}_3$ is high), e.g., at $t_{13}$, the attenuator is reset (i.e., is connected to the offset); when $\phi_4$ is high, e.g., at $t_{14}$, the attenuator 10 and the amplifier 21 are both reset; and when $\phi_5$ is high, e.g., at $t_{15}$, the sample-and-hold circuit 30 samples the output of the amplifier 21.

Figure 1:
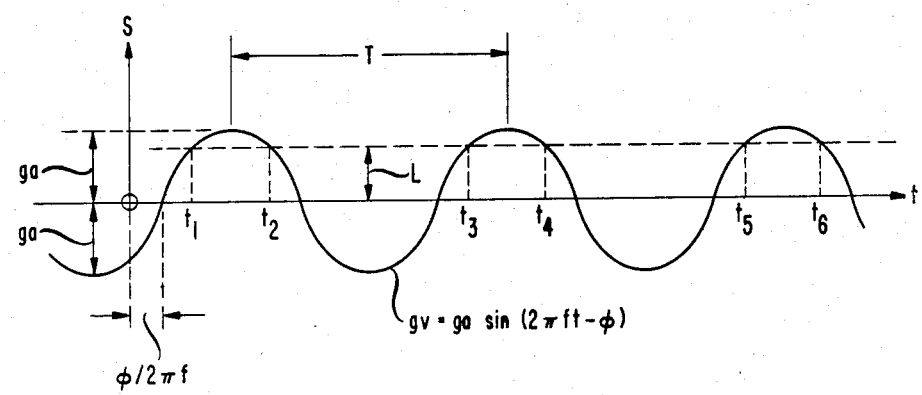
FIG. 1 is a plot of amplifier output signal voltage strength S versus time t useful for understanding the operation of an AGC circuit.
Figure 3:
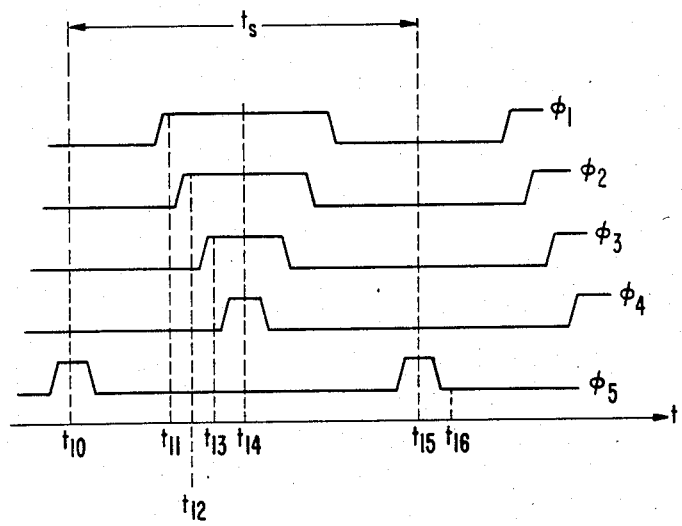
FIG. 3 is a timing diagram useful for describing the operation of the embodiment shown in FIG. 1.

During operation, at time $t_{10}$ (FIG. 3), the switches are set as shown in FIG. 2. In particular, since the clocked ($\bar{\phi}_1$) switch 11.1 is closed, the input AGC signal v is delivered to the input terminal 10.1 of the attenuator 10; since the clocked ($\phi_2$) switch 95 is open, feedback of the AGC output gv at the AGC circuit output terminal 61 through R3 is disconnected from and not allowed to flow to the attenuator 10; and since the clocked ($\bar{\phi}_3$) switch 62 is closed, the NAND gates 81, ..., 82,83, .. ., 84 enable the reading of the counter 70 to be reflected in the attenuator switches 13,14, ..., 19,20 (i.e., 1 bit in the counter acts through the corresponding NAND gate and the corresponding one of the inverters 91, ... , 92,93, ..., 94 to connect the bottom terminal of the corresponding one of the attenuate capacitors C11, ... , C16,C17, ..., C22 to ground; a zero bit acts to connect the bottom terminal of the corresponding capacitor to the input terminal 10.1 and hence to the input signal v). Moreover, since the clocked ($\phi_4$) switch 12 is open, the top terminal of each of the attenuator capacitors is disconnected from ground, so that the output terminal 10.2 of the attenuator 10 delivers to the input terminal 20.1 of the amplifier arrangement 20, a voltage that depends upon instantaneous strength of the AGC input signal v. At the same time $t_{10}$, since the clocked ($\phi_5$) switch 31 in the sample-and-hold circuit 30 is closed, the voltage developed at the output terminal 20.2 of the amplifier arrangement 20 is delivered to the sample-and-hold circuit 30, and the sample-and-hold circuit 30.2 thus develops a corresponding voltage gv at its output terminal 30.2 and hence at the AGC circuit output terminal 61. In turn, the voltage gv is fed back to the comparator 40.

If the voltage gv exceeds the level L, then the output of the comparator 40 is high, and it is low otherwise. Depending upon whether the output of the comparator is high or low, and further depending upon the structure of the control logic 50, the control logic tends to increase or decrease the reading of the counter 70, as more fully described below.

Later, at time $t_{14}$ (FIG. 3), we have a reset situation: the clocked ($\bar{\phi}_1$) switch 11.1 is open, and the clocked ($\phi_2$) switch 95 is closed, whereby the AGC circuit output gv is fed back through the lowpass filter formed by C3 and R3 to the input terminal 10.1 of the attenuator 10. This feedback corresponds to dc offset in the AGC input signal v plus any other offsets in the AGC circuit, provided R3C3 is sufficiently large to correspond to a time duration defining such an offset typically 0.1 second and in any case much longer than the periodicity of the signal components of v. At the time $t_{13}$, the clocked ($\phi_3$) switch 61 is closed, whereby one input terminal of each of the NAND gates is grounded and hence the output of every NAND gate is high (and of every inverter is low), so that the bottom terminal of each of the attenuator capacitors C11, ..., C16,C17, ..., C22 is connected to the offset at N3 through the clocked ($\phi_2$) switch which is also then closed (switches 14, 16, 18, and 20 are then closed, switches 13, 15, 17, and 19 are then open). Moreover, at time $t_{14}$, the clocked ($\phi_4$) switch 12 in the attenuator 10 is also closed, whereby the top terminal of each of the attenuator capacitors C11, ..., C16 is connected to ground, whereby the attenuator is reset to the feedback offset developed at N3 by the filter R3C3. Furthermore, at this same time $t_{14}$, the clocked ($\phi_4$) switches 22 and 23 in the amplifier arrangement 20 are closed, whereby the amplifier arrangement 20 is also reset. Finally, at time $t_{16}$, the clocked ($\phi_5$) switch 31 in the sample-and-hold circuit 30 is open, whereby the sample-and-hold circuit 30 retains on its capacitor C5 the earlier voltage delivered to it when the clocked ($\phi_5$) switch 31 was opened (i.e., when $\phi_5$ last went low), and hence the sample-and-hold continues to deliver substantially the same earlier voltage gv which it was delivering when the switch 31 was opened.

A straightforward calculation shows that connecting the terminals of each of the capacitors C11, ... C16,C17, ... C22 (as at time $t_{14}$) across an offset voltage (here equal to the voltage at node N3) followed by the opening of the clocked ($\phi_2$) switch 12, followed by the application of either a high or low level of voltage to the bottom terminal of each of these same capacitors, results in a voltage being developed at the output terminal 10.2 of the attenuator 10 that is directly proportional to the AGC input signal v multiplied by the value in binary of the complement of the reading of the counter 70 (i.e., a one becomes a zero and vice-versa) less the offset voltage (at node N3), provided that the capacitors C11, ..., C16,C17, ..., C22, and C10 are interrelated as described above, the bit reading at terminal 74 of the counter 70 corresponding to the least significant bit (LSB), and the bit reading at terminal 71 of the counter corresponding to the most significant bit (MSB). Thus, the attenuator 10 serves to attenuate the signal v, as it goes from the AGC input terminal 11 to the amplifier arrangement 20, by an amount which is proportional to the value in binary of the reading of the counter 70: the higher the reading of the counter, the more the attenuation, i.e., the more the reduction in signal delivered to the input terminal 20.1 of the amplifier arrangement 20. At the same time, the subtraction by the attenuator 10 of the offset (at node N3) prevents any offset—caused by any offsets either in the signal or in the circuit itself—from being amplified by more than about unity gain.

Figure 4:
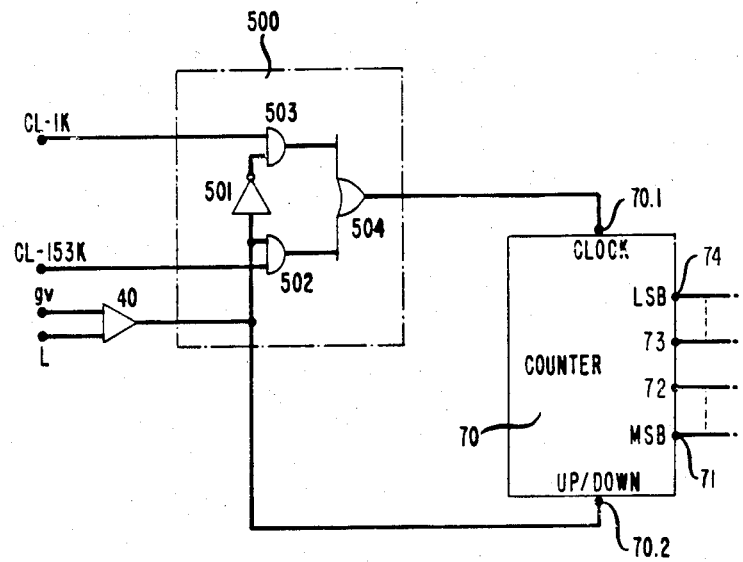
FIG. 4 is a diagram of a control logic device useful in the embodiment shown in FIG. 2 in accordance with a specific embodiment of the invention.

The structure of the control logic 50 determines the precise nature of the effect of a zero versus one output of the comparator 40 upon the reading of the counter 70. In particular, FIG. 4 shows a fairly simple control logic device 500 for use as the control logic 50 in the AGC circuit of FIG. 2. This device 500 includes a pair of AND gates 502 and 503, each of whose output terminals is connected to a separate input terminal of an OR gate 504. One of the input terminals of the AND gate 503 is connected to a clock sequence supply terminal CL-1K at which a relatively slow clock pulse sequence is applied, typically having a clock frequency of about 1 KHz; the other of the input terminals of the AND gate 503 is connected through an inverter 501 to the output terminal of the comparator 40. One of the input terminals of the AND gate 502 is connected to another clock sequence supply terminal CL-153K, at which another, relatively very fast, clock pulse sequence is applied, typically having a clock frequency of about 153 KHz; the other of the input terminals of the AND gate 502 is connected to receive the output of the comparator 40. The output terminal of OR gate 504 is connected to the clock terminal 70.1 of the counter 70.

During operation, the counter can count up only when a high voltage level is being applied by the comparator 40 to the up/down input terminal 70.2, i.e., only when the AGC output gv is greater than the prescribed level L; otherwise the counter can count only down, i.e., when gv is less than L. On the other hand, the rate at which the counter 70 counts at all, up or down, is equal to the frequency of the pulse sequence (if any) then being applied to the clock input terminal 70.1 of the counter. For example, when gv is greater than L, the output of the comparator 40 is high, and hence the AND gate 502 passes the faster clock pulse sequence CL-153K to the OR gate 504 which in turn passes this sequence CL-153K to the clock input terminal 70.1, so that the counter 70 counts up at the fast rate of CL-153K. At the same time, an input terminal of the AND gate 503 receives a low level from the inverter 501 (i.e., the inverted level of the output of the comparator 40), so that this AND gate 503 cannot pass the slower clock sequence CL-1K. Conversely, when gv is less than L, then the up/down terminal 70.2 receives a low level from the comparator 40 while this AND gate 503 passes the slower clock sequence CL-1K through the OR gate 504 to the clock input terminal 70.1; and accordingly, the counter 70 counts down at the slow rate of CL-1K. To summarize, the reading of the counter 70 goes up and hence increases the attenuation of the attenuator 10 at the fast rate (fast acquisition) when the AGC output gv is greater than L, and the reading of the counter 70 goes down at a slow rate (slow release) and hence decreases the attenuation at the slow rate when gv is less than L—just as is desired in an AGC circuit, i.e., fast acquisition and slow release.

Figure 5:
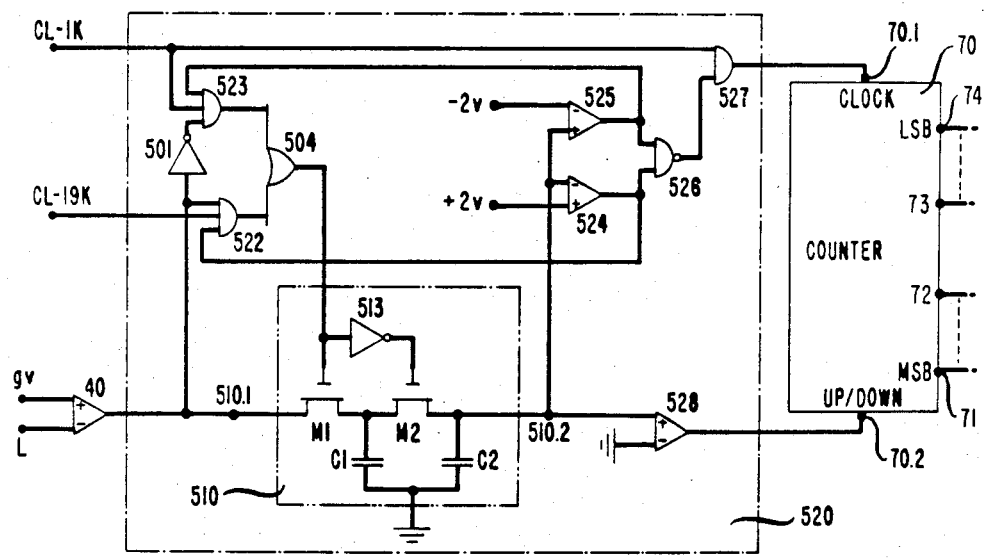
FIG. 5 is a diagram of another control logic device useful in the embodiment shown in FIG. 2 in accordance with another specific embodiment of the invention.

FIG. 5 illustrates a control logic device 520 which has the additional feature of latency to suppress jitter; that is, the counter 70 does not count up or down but remains fixed in cases of sinusoidal output signals gv which fluctuate in amplitude by relatively small amounts. In such cases, in the absence of the latency feature, the attenuation would fluctuate by at least one significant bit, and in cases where the reading on the counter was relatively low, such fluctuation of the reading would cause significantly undesirable variations (jitter) in the output gv. The latency feature freezes the reading of the counter in such cases, as more fully described below.

In FIG. 5, the control logic device 520 includes a switched capacitor integrating filter 510 having an input terminal 510.1 and an output terminal 510.2. The input terminal 510.1 is connected for receiving the output of the comparator 40. The output terminal 510.2 is connected to a positive input terminal of another comparator (or level shifter) 528 whose negative input terminal is connected to ground, and whose output terminal is connected to the up/down terminal 70.2 of the counter 70.

The integrating filter 510 comprises a pair of series-connected transistors M1 and M2 connected for feeding charge to a relatively small capacitor C1 and a relatively large capacitor C2, respectively. The ratio of the capacitance C2 to the capacitance C1 multiplied by the clock period CL-1K or CL-19K (depending upon which clock is passed by the OR gate 504) is proportional to the latency or integration time. The capacitance C2 is about 40 picofarads, and the capacitance C1 is about 0.2 picofarad. The gate terminal of M1 is connected to the output terminal of the OR logic gate 504 and through an inverter 513 to the gate terminal of the transistor M2. It is important to note that additional circuitry, as known in the art, should be inserted to prevent M1 and M2 from ever being on simultaneously.

The output terminal 510.2 of the filter 510 is also connected to the negative and positive input terminals, respectively, of a pair of comparators 524 and 525. The positive input terminal of the comparator 524 is connected to a positive voltage level supply terminal +2 v at which a steady dc positive voltage is applied, typically 2 volts. The negative input terminal of the comparator 524 is connected to a negative voltage supply terminal −2 v at which a steady dc negative voltage is applied, typically −2 volts. The output terminal of the comparator 524 is connected both to an input terminal of a NAND gate 526 and to an input terminal of a triple input AND gate 522, whereas the output terminal of the comparator 525 is connected both to another input terminal of the NAND gate 526 and to an input terminal of another triple input AND gate 523. Note that the output of the NAND gate 526 will be low if and only if the outputs of both comparators 524 and 525 are high, i.e., if and only if the voltage at the output terminal 510.2 of the integrating filter 510 lies between −2 volts and +2 volts.

The output terminal of the NAND gate 526 is connected to an input terminal of an AND gate 527 whose other input terminal is connected to the slow clock sequence supply terminal CL-1K and whose output terminal is connected to the clock input terminal 70.1 of the counter 70. Thus, when the voltage at the output terminal 510.2 of the integrating filter 510 is outside the range −2 v to +2 v, the output of the NAND gate 526 is high, and hence the AND gate 527 enables the clock sequence CL-1K to cause the counter 70 to count at the 1K rate, up or down, depending upon whether the instantaneous voltage at the output terminal 510.2 of the filter 510 is then positive or negative, respectively.

The output terminal of the comparator 40 is also connected to another input terminal of the triple input AND gate 522 and, through an inverter 501, to another input terminal of the triple input AND gate 523. A clock sequence supply terminal CL-19K, to which is applied a moderately fast clock pulse sequence typically of 19 KHz, is connected to still another input terminal of the AND gate 522.

During operation, assume that the voltage at the output terminal 510.2 of the integrating filter 510 is instantaneously somewhere between −2 volts and +2 volts. Accordingly, the outputs of both the comparators 524 and 525 and hence both inputs to the NAND gate 526 are logic high, and hence the output of this NAND gate 526 is low, whereby the AND gate 527 is disabled from passing the clock sequence CL-1K to the clock input terminal 70.1 of the counter 70. Thus, the counter 70 is frozen. At the same time, the counter is thus frozen, either the AND gate 522 will pass the fast clock sequence CL-19K to the OR gate 504 or else the AND gate 523 will pass the slow clock sequence CL-1K to the OR gate 504, depending upon whether the AGC output gv is instantaneously above or below the prescribed level L, respectively. Thus, for example, when the AGC output gv is above L, then the OR gate 504 passes the fast clock sequence CL-19K from the AND gate 522 to the gate terminal of the transistor M1 and passes the complement of CL-19K (through the inverter 513) to the gate terminal of M2, whereby the small capacitor C1 acts as a fast switched capacitor and repeatedly delivers charge packets to the large capacitor C2 so that the voltage across the large capacitor C2 increases on each cycle of the clock CL-19K by an amount equal to $C1(V1-V2)/(C1+C2)$, or approximately $(C1/C2)(V1-V2)$ since C2 is much larger than C1, where V1 is the voltage delivered to C1 by the comparator 40, and V2 is the voltage developed across the capacitor C2 (V2 is the same as the voltage at the output terminal 510.2 of the filter 510). Advantageously, the value of V1 is selected to be significantly greater than the highest attainable value of V2 during operation. As explained below, the highest attainable value of V2 is only infinitesimally higher than +2 v; the lowest is only infinitesimally lower than −2 v. For example, the value of V1 is selected to be about +5 volts. Thus, it follows that the increase $(C1/C2)(V1-V2)$ in the value of V2 during each cycle of the fast clock sequence CL-19K is but a small fraction of the magnitude of V1. Accordingly, when the counter 70 is frozen (because V2 is greater than −2 v but less than +2 v), if gv is greater than L, then the voltage at the output terminal 510.2 climbs by a small fraction of V1 during each cycle of the clock CL-19K. If gv persists in being greater than L, ultimately after many cycles of CL-19K, the voltage V2 at the output terminal 510.2 of the filter 510 attains and infinitesimally exceeds the value +2 v, at which point the comparator 524 suddenly shifts its output from logic high to logic low, disabling the AND gate 522 and hence preventing any further increase in V2. At the same time, because of this shift in output of the comparator 524 to logic low, the NAND gate 526 changes its output from logic low to logic high, and hence the AND gate 527 enables the clock sequence CL-1K to be delivered to the clock terminal 70.1 of the counter 70, whereby the counter is unfrozen. Because the output terminal 510.2 of the filter 510 has been delivering, and continues to deliver, a positive voltage to the comparator 528, this comparator 528 has been delivering and continues to deliver a high logic level to the up/down terminal 70.2, and so the counter counts up at the rate of the clock CL-1K, increasing the attenuation of the attenuator 10 and hence tending to decrease the AGC output gv, as is desired of an AGC circuit when gv is greater than L.

On the other hand, when the counter is frozen (because the voltage of output terminal 510.2 of the integrating filter 510 is in the range between −2 v and +2 v) but the AGC output gv is less than L, then the output of the comparator 40 is logic low, so that the AND gate 523 enables the slow clock sequence CL-1K to pass through the OR gate 504 to the gate terminal of the transistor M1. At the same time, the comparator 40 delivers to the input terminal 510.1 of the filter 510 a negative voltage level, typically −5 volts, which is advantageously lower than the lowest attainable value (−2 v) of the voltage V2 across the capacitor C2. In this way, the small capacitor C1 acts as a slow switched capacitor which reduces the voltage V2 across the capacitor C2 and hence reduces the voltage of the output terminal 510.2 of the filter 510 by a small fraction during each cycle of the slow clock sequence CL-1K, until ultimately after many cycles of CL-1K (gv persisting below L), the voltage at the output terminal 510.2 of the filter 510 falls infinitesimally below −2 v, and hence the output of comparator 525 shifts from a high to a low logic level. As a consequence of this shift, the AND gate 523 is disabled from passing the clock CL-1K (the AND gate 522 remains disabled from passing CL-19K) to the filter 510; and at the same time, the NAND gate 526 shifts its output from low to high, whereby the AND gate 527 enables the clock CL-1K to pass to the input terminal 70.1 of the counter 70, whereby counter 70 counts down (because the comparator 528 is delivering a low level to the up/down terminal 70.2 of the counter) at the rate of the slow clock CL-1K. Accordingly, the attenuation being imposed by the attenuator 10 decreases, as is desired when the AGC output gv is less than the prescribed level L.

When the NOR gate 526 delivers a low logic level to the AND gate 527—i.e., when the voltage at the output terminal 510.2 of the filter 510 lies within the range −2 v to +2 v and hence the outputs of both comparators 524 and 525 are high—then the AND gate 527 is disabled and does not pass the clock sequence CL-1K to the clock input terminal 70.1 of the counter 70, and thus the counter is frozen. In other words, latency is then said to be in effect.

A steady state can be reached with the control logic 520 if the counter is frozen (because the voltage V2 at the output terminal 510.2 of the integrating filter 510 is within the range between −2 v and +2 v), and at the same time if the AGC output gv fluctuates above and below the prescribed level L such that the ratio of the average of the time intervals during which gv is below L to the average of the time intervals during which gv is above L is equal to the ratio of the frequency of the fast clock CL-19K to that of the slow clock CL-1K (i.e., typically 19 to 1). In such a state, for example, when gv is a sinusoidal varying voltage, during each period of fluctuation of gv, when gv is less than L, the voltage V2 decreases at the slow clock rate, and when gv is greater than L, the voltage V2 increases at the fast rate but only during a time interval which is relatively small (i.e., typically by the ratio 1 to 19) compared with the time interval during which the voltage V2 decreases. Of course, the frequency of the clock CL-1K should not be too much larger than that of the ac component of the AGC input signal v and hence of the ac component of gv, lest (during what should be a steady state) the voltage V2 be reduced below the critical value −2 v (when gv undergoes its excursion where gv is below L) before the voltage V2 is subsequently increased (when gv subsequently undergoes its excursion where gv is above L). In this way, in the steady state there is absolute latency in the sense that the attenuation of the attenuator is absolutely fixed and does not change unless and until the signal v undergoes a significant change in amplitude for an extended period of time.

Figure 6:
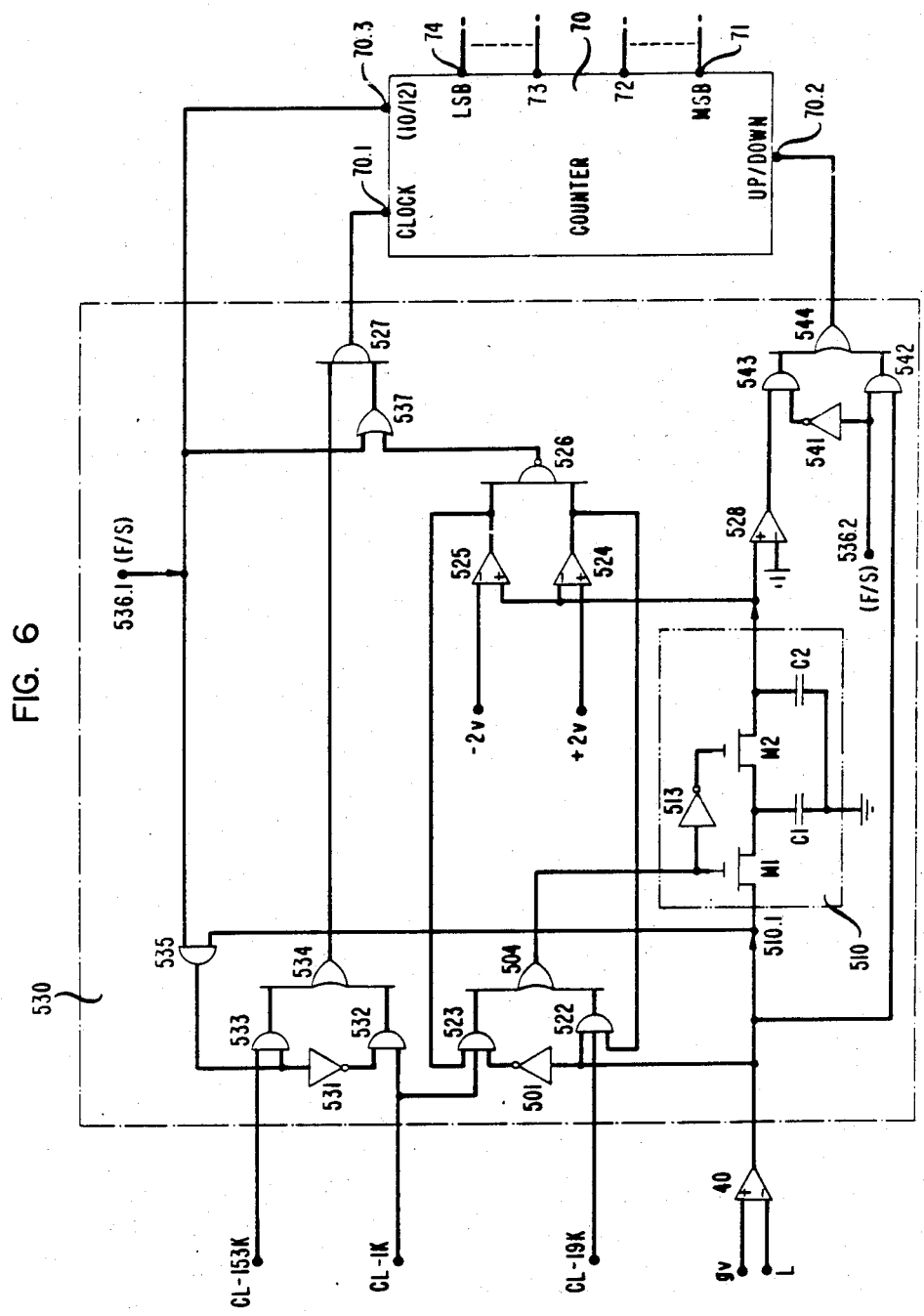
FIG. 6 is a diagram of yet another control logic device useful in the embodiment shown in FIG. 2 in accordance with yet another specific embodiment of the invention.

FIG. 6 illustrates a control logic device 530 which combines the features of the previously described devices 500 (FIG. 4) and 520 (FIG. 5) in a dual mode of operation capability, so that during initial acquisition ("signing on") and release, the device 530 operates in a first mode just as the control logic device 500, with the very fast clock sequence CL-153K for acquisition (and the slow clock CL-1K for release), and so that during subsequent (after signing on) acquisition and release, the device 530 operates in a second mode as the control logic device 520 (FIG. 5) with the moderately fast clock sequence CL-19K for controlling latency during acquisition (and the slow clock CL-1K for release) during latency and for both acquisition and release during non-latency. The first (faster) mode is denoted by F; the second (slower) mode by S. The desirability of such dual mode operation stems from the fact that ordinarily when no signal at all is being received ("signal off"), the reading on the counter 70 is preset at a minimum, and hence the attenuation is then at a minimum; and when the initial signal suddenly is received, the reading on the counter should increase to a substantial value (depending upon the amplitude of the signal in order to acquire the signal) in a relatively short time interval. Hence, there is a need for using the very fast clock CL-153K during the fast mode F. Thereafter, during further signal reception, the medium fast clock CL-19K is more suitable during the slower mode S, especially since then the latency property is being utilized and thus the faster clock CL-153K is not so suitable at that time. On the other hand, even using the very fast clock CL-153K may not be sufficient for obtaining the desired sufficiently fast initial acquisition. Accordingly, the counter 70 is arranged with an added (10/12) input terminal 70.3 which enables the counter to switch the least significant bit from the lowest bit (typically the 12th bit) to the next-to-the-next-to-the-lowest bit (typically the 10th bit), whereby during the faster mode F on each cycle of the clock CL-153K, the 10th bit advances by one unit (provided the up/down terminal 70.1 is then receiving a high logic level voltage), and during the slower mode S on each cycle of the clock CL-1K, the 12th bit advances or recedes by one unit (depending upon high versus low level that the up/down terminal 70.1 is then receiving).

The faster mode F is activated by a high logic level applied at F/S mode selector input terminals 536.1 and 536.2. In response thereto, the AND gate 542 is enabled, by the high level received from the F/S input terminal 536.2, to pass the output of the comparator 40 to the up/down terminal 70.1. At the same time, the AND gate 543 is disabled by a low level received from the inverter 541. Also, in response to the high level received from the F/S terminal 536.1, the AND gate 535 allows the passage of the output of the comparator 40 to the AND gate 533 and the passage of the inverse (complement) of the output of the comparator 40 to the AND gate 532 (through an inverter 531). At that time also, the F/S terminal 536.1 delivers a high logic level to the OR gate 537 which, in turn, therefore delivers a high logic level to the AND gate 527. Consequently, when the output of comparator 40 is high, the AND gate 533 passes the clock sequence CL-153K to the OR gate 534 and hence to the AND gate 527 which, in turn, passes the clock sequence CL-153K to the clock input terminal 70.1 of the counter 70, because then the AND gate 527 is being enabled by a high logic level from the OR gate 537 which, in turn, is being fed a high logic level from the F/S terminal 536.1. Moreover, the up/down terminal 70.1 is then receiving from a path through the AND gate 542 and the OR gate 544 the high level output of the comparator 40. Thus the clock 70 counts up at the clock rate CL-153K, as is desired during fast mode acquisition. When the output of the comparator 40 goes low (F/S remaining high), the AND gate 535 delivers a low level to the AND gate 533 to disable it from passing the clock CL-153K to the OR gate 534, but a high level is then delivered through the inverter 531 to the AND gate 532 to enable it to pass the clock CL-1K to the OR gate 534, whereby the OR gate 534 delivers the clock CL-1K to the AND gate 527 which, in turn, being enabled by the high level of F/S, passes this clock CL-1K to the clock input terminal 70.1 of the counter. Accordingly, the counter 70 counts down at the rate of the clock CL-1K (with the least significant bit being equal to the 10th bit), as is desired during faster mode release.

The slower mode S is activated by a low logic level applied to the F/S terminals 536.1 and 536.2. In response thereto, the AND gate 542 is disabled, but the AND gate 543 is enabled by a high level from the inverter 541. At the same time, the (10/12) input terminal 70.3 of the counter receives a low level, whereby the counter advances or recedes (depending upon the logic level being received at the up/down terminal 70.1) by one unit in the 12th bit upon each cycle of the clock sequence (if any) being applied to the clock input terminal 70.1. Also at the same time, the AND gate 543 passes the output of the comparator 528, corresponding to the output of the integrating filter 510, to the up/down terminal 70.1 of the counter; and the AND gate 535 receives a low level for the F/S terminal 536.1, whereby the AND gate 535 delivers a low level to the AND gate 533 which disables the clock sequence CL-153K from passing to the OR gate 534 but, because of the inversion supplied by the inverter 531, enables the clock sequence CL-1K to pass through the OR gate 534 to the AND gate 527. As a consequence, the AND gate 527 delivers the clock sequence CL-1K to the clock input terminal 70.1 of the counter 70 provided that this AND gate 527 is enabled by a high level from OR gate 537 and hence (because the F/S input to the OR gate 537 is slow) provided that the NOR gate 526 is then delivering a high level to the OR gate 537, i.e., provided that the latency is not in effect as described above in connection with FIG. 5. Accordingly, the counter 70 advances or recedes by one bit in the 12th bit during each cycle of the clock sequence CL-1K. Otherwise, when latency is in effect, the AND gate 527 is disabled and no clock sequence is delivered to the clock input terminal 70.1 of the counter 70, and so the counter is frozen, as is desired during latency. Moreover, this latency is controlled (when F/S is low) in the same manner as previously described in connection with FIG. 5, since when F/S is low, the AND gate 543 and the OR gate 544 pass the output of the comparator 528 to the up/down terminal 70.1, the AND gate 542 being disabled, so this up/down terminal receives the output of the comparator 528 just as in FIG. 5, and at the same time the AND gates 535 and 533 are disabled while the AND gate 532 is enabled and passes the clock sequence CL-1K through the OR gate 534 to the AND gate 527 which is disabled during and only during latency but is enabled otherwise, so the clock terminal 70.1 of the counter 70 receives no clock sequence (counter is frozen) during latency but receives the clock sequence CL-1K otherwise, just as in FIG. 5.

Although the invention has been described in detail in terms of specific embodiments, various modifications can be made without departing from the scope of the invention. For example, a reprogrammable microprocessor can be incorporated into the control logic device in order to modify, for example, the latency range or any other parameter of the feedback. It should be noted that instead of presetting (just before "signing on") the counter 70 for minimum attenuation, the counter can be preset to any convenient expected value or approximation thereto, or to the attenuation at the end of the earlier signing on, whereby the initial acquisition time can be desirably reduced.

What is claimed is:

1. An automatic gain control circuit comprising
   (a) a digital electronic counter;
   (b) a multiplying digital-to-analog converter connected for directly attenuating an input signal in accordance with the instantaneous reading of the counter, to produce an attenuated signal;
   (c) an amplifier arrangement connected for receiving the attenuated signal and for developing an amplified output signal in accordance with the attenuated signal;
   (d) a comparator means connected for receiving the amplified output signal and for generating a binary comparator output signal to increase or decrease the reading of the counter depending upon whether the amplified output signal is above or below a prescribed level; and
   (e) a latency network, connected for intergrating the binary comparator output signal and for enabling the reading of the counter to increase or decrease when and only when the binary signal integrates to a value which is above or below, respectively, first or second reference values.

2. The circuit of claim 1 in which the multiplying digital-to-analog converter is essentially a switched capacitor attenuator.

3. The circuit of claim 2 which further includes means for referencing the multiplying digital-to-analog converter to a low pass component of the amplified output circuit in order to reduce dc offset amplification.

4. The circuit of claim 1 which further includes means for referencing the multiplying digital-to-analog converter to a low pass component of the amplified output circuit in order to reduce dc offset amplification.

* * * * *